United States Patent [19]

Shibata et al.

[11] Patent Number: 4,494,005
[45] Date of Patent: Jan. 15, 1985

[54] BEAM SCANNING CONTROL DEVICE FOR ION IMPLANTATION SYSTEM

[75] Inventors: Atsushi Shibata; Yukichi Ueno, both of Katsuta, Japan

[73] Assignee: Hitachi, Ltd., Tokyo, Japan

[21] Appl. No.: 584,386

[22] Filed: Feb. 28, 1984

Related U.S. Application Data

[63] Continuation of Ser. No. 242,612, Mar. 11, 1981, abandoned.

[30] Foreign Application Priority Data

Mar. 11, 1980 [JP] Japan .................. 55-31337

[51] Int. Cl.$^3$ .......................................... G01N 23/00
[52] U.S. Cl. .................... 250/492.2; 250/397
[58] Field of Search .............. 250/492.2, 398, 397

[56] References Cited

U.S. PATENT DOCUMENTS 3,547,074  12/1970  Hirschfeld ............... 250/492.2
3,689,766   9/1972  Freeman ................. 250/492.2
3,778,626  12/1973  Robertson .
4,021,675   5/1977  Shifrim ................. 250/492.2
4,228,358  10/1980  Ryding .................. 250/492.2

Primary Examiner—Bruce C. Anderson
Attorney, Agent, or Firm—Antonelli, Terry & Wands

[57] ABSTRACT

In an ion implantation system wherein an ion beam is scanned by deflection means in a predetermined direction on substrates placed on a disc rotating at a constant speed, to implant the substrates with ions; ion beam detectors are arranged in correspondence with a plurality of places of the substrate before the ion implantation. When the ion beam is scanned, sums of outputs of the respective ion beam detectors in the plurality of scanning positions are evaluated, and correction operations are executed so that they may become constant values. The scanning rate of the ion beam by the deflection means is controlled according to the corrections. Thus, when the ion beam is actually implanted into the substrate, the density of the ion beam becomes uniform.

10 Claims, 3 Drawing Figures

BEAM SCANNING CONTROL DEVICE FOR ION IMPLANTATION SYSTEM

This is a continuation of application Ser. No. 242,612 filed Mar. 11, 1981, now abandoned.

BACKGROUND OF THE INVENTION

This invention relates to improvements in a circuit for controlling the scanning rate of an ion beam in an ion implantation system.

In recent years, in the field of the manufacture of semiconductor devices, the ion implantation method has been introduced for the doping of a semiconductor substrate with an impurity instead of the conventional thermal diffusion method.

The ion implantation method is such that an impurity, for example, phosphorus or boron is efficiently ionized, that the impurity ions are accelerated in a high vacuum vessel with a high voltage, and that a silicon substrate (or wafer) is irradiated and implanted with the accelerated ions.

As disclosed in U.S. Pat. No. 3,778,626, an ion implantation system suitable for the mass production carries out the ion implantation by rotating a disc on which a large number of wafers are placed along a circumference. The ion implantation of the wafers proceeds while rotating the disc at a constant speed about the axis of rotation thereof and scanning an ion beam radially of the disc. In this case, as the ion beam scans towards the axis of rotation of the disc, the linear velocity of the ion beam relative to the disc lowers. This results in the problem that the quantity of the ions implanted in the wafer is larger in the central part of the disc than in the outer peripheral part thereof, so a uniform ion implantation is impossible.

The ion beam is deflected by a deflecting magnetic field externally established, to perform the radial scanning of the disc. This leads to the problem that the sectional shape and density distribution of the ion beam change subtly due to ununiformity in the deflecting magnetic field, the fringe effect at an end part of the magnetic field, etc., so a uniform ion implantation is impossible.

SUMMARY OF THE INVENTION

An object of this invention is to provide a circuit for controlling the scanning rate of an ion beam in an ion implantation system, the control circuit permitting a uniform ion implantation whenever the ion beam is scanned and implanted into substrates.

This invention is characterized in that ion detectors are disposed in correspondence with a plurality of places of a substrate to be implanted with an ion beam, that before the ion implantation into the substrate is actually carried out, the ion beam is scanned, that the sum of detection signals from the respective ion detectors as based on the scanning is evaluated, and that when the ion implantation into the substrate is actually performed, the quantity of implantation of the ion beam is corrected so that the sum may become a desired prescribed value, the scanning rate being automatically corrected in accordance with the corrected quantity of implantation.

DESCRIPTION OF THE PREFERRED EMBODIMENT

Figure 1:
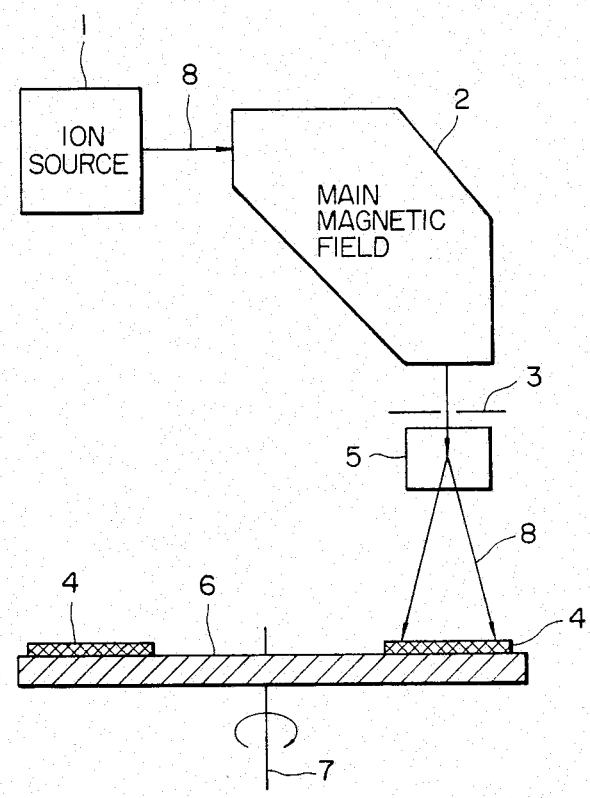
FIG. 1 is an explanatory view showing the principle of an ion implantation system to which this invention is applied.

The principle of an ion implantation system to which this invention is applied will be described with reference to FIG. 1. In FIG. 1, an impurity such as phosphorus and boron to be implanted into wafers 4 is ionized by the microwave plasma discharge in an ion source 1, and the impurity ions are accelerated and emitted in the form of an ion beam 8. The ion beam 8 is separated according to respective mass numbers by a main magnetic field 2, and only specified ions pass through a slit 3. The resultant ion beam 8 is deflected by a deflecting magnetic field 5, to scan the surface of the wafer 4 in the radial direction of a rotary disc 6 and to implant the ions into the surface of the wafer 4. The rotary disc 6 is rotating at a constant speed about an axis of rotation 7 thereof in the state in which the large number of wafers 4 are placed thereon along a circumference. Therefore, as the ion beam 8 comes closer to the center of the rotary disc 6 while scanning the surface of the wafer 4, nonuniformity in the quantity of ion implantation appears due to the lowering of the linear velocity in the part of the wafer 4 to be implanted or due to the influence of the deflecting magnetic field 5.

Figure 2:
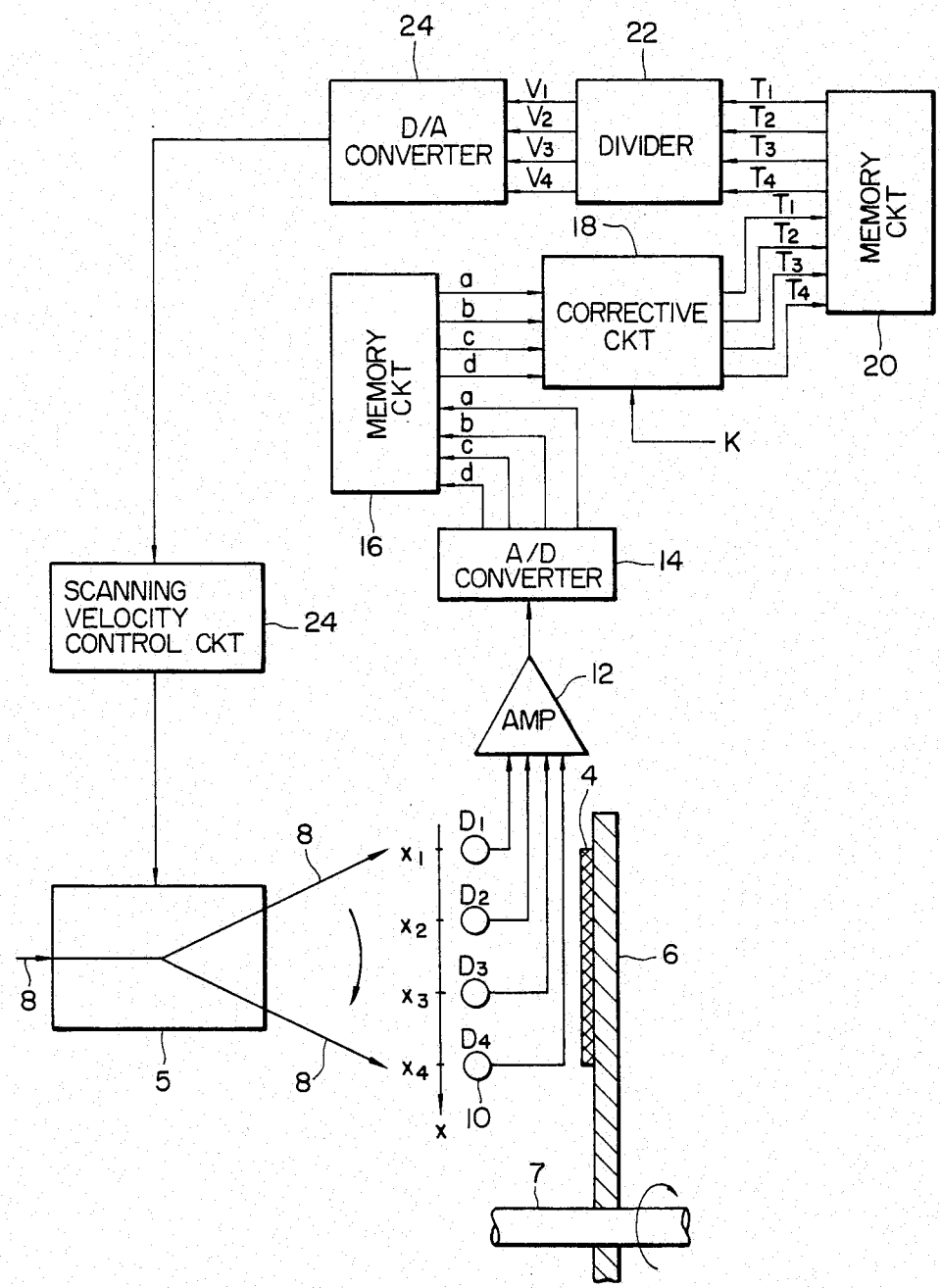
FIG. 2 is a diagram showing an embodiment of the control of the scanning rate of an ion beam according to this invention.

An embodiment of this invention having eliminated such nonuniformity in the quantity of ion implantation is shown in FIG. 2. Referring to FIG. 2, the rotary disc 6 carrying the wafers 4 thereon is rotating at a constant speed about the axis of rotation 7, while the ion beam 8 is deflected in the direction of arrow by the deflecting magnetic field 5 and implants the ions into the wafer 4.

Previous to such ion implantation, a beam detection device 10 in which four beam detectors such as photoelectric detectors $D_1$–$D_4$ are mounted at equal intervals is inserted in the scanning range of the ion beam, that is, the range which covers the wafer 4. The number of the beam detectors $D_1$–$D_4$ is not restricted to four, but a larger number is better for attaining precise data.

Outputs of the respective beam detectors $D_1$–$D_4$ are amplified by an amplifier 12, and are thereafter converted into digital signals by an analog-to-digital converter 14. Here, when the ion beam 8 has been deflected in the direction of arrow in the deflecting magnetic field 5, beam intensifies of the ion beam 8 at points $x_1$–$x_4$ on an x-axis as are the output signals of the respective beam detectors $D_1$–$D_4$ become characteristics shown in FIG. 3. The axes of abscissas in FIG. 3 indicate Nos. of the beam detectors, while the axes of ordinates denote the beam intensities. More specifically, at the point $x_1$ at which the ion beam 8 has deflected upwards, the output signal $a_1$ of the beam detector $D_1$ becomes the greatest and the output signal $d_1$ of the beam detector $D_4$ becomes the smallest, so that an output distribution lowering rightwardly is exhibited. At the point $x_2$, the output signal $b_2$ of the beam detector $D_2$ and the output signal $c_2$ of the beam detector $D_3$ are high and have approximately equal values, whereas the output signals $a_2$ and $d_2$ have low values. Likewise, at the point $x_3$, the output signal $c_3$ of the beam detector $D_3$ becomes the greatest, and at the point $x_4$ at which the ion beam 8 is the closest to the center of rotation, the output signal $d_4$ of the beam detector $D_4$ becomes the greatest and the output signal $a_4$ of the beam detector $D_1$ becomes the smallest.

Figure 3:
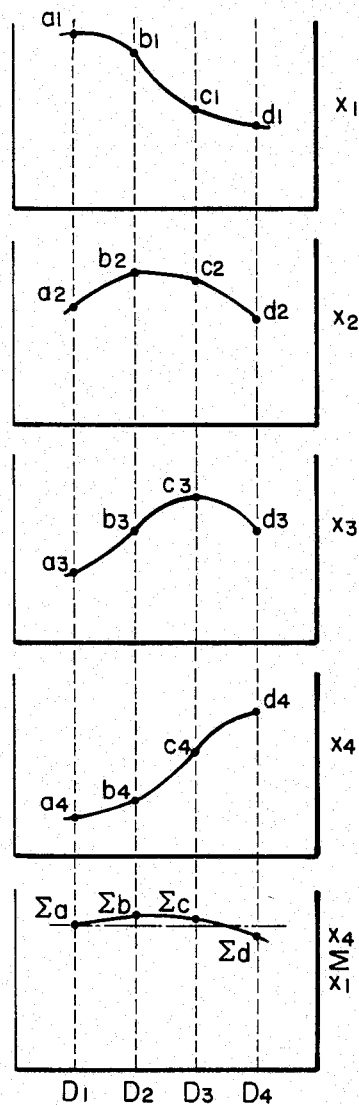
FIG. 3 shows graphs in which output signals of beam detectors in FIG. 2 are recorded for the respective scanning abscissas of the ion beam.

Values obtained in such a way that the signal values a–d of the respectively deflected ion beams 8 at the points $x_1$–$x_4$ are added up for the respective beam detectors are indicated in the graph of the lowest stage in FIG. 3. The values $$\sum_{x_1}^{x_4}$$

are expressed as $\Sigma a$, $\Sigma b$, $\Sigma c$ and $\Sigma d$ on a line slightly lowering rightwards. If the sectional shape and density distribution of the ion beam 8 remain unchanged in all the scanning positions, the summation values ought to become $\Sigma a = \Sigma b$ $\Sigma c = \Sigma d$, and the aforecited distribution curve ought to become a straight line parallel to the axis of abscissas. In actuality, however, the summation values are liable to become a nonuniform distribution curve as described above. This invention consists in a method wherein the scanning rate of the ion beam 8 is varied so that the distribution curve of $$\sum_{x_1}^{x_4}$$

may become the straight line parallel to the axis of abscissas. Supposing that $\Sigma a$ is a desired value as reference, at the positions of the intermediate beam detectors $D_2$ and $D_3$ exhibiting greater summation values, the scanning rate is made higher to reduce the quantity of ion implantation, and when the center of the ion beam 8 scans the beam detector $D_4$, the scanning rate is made lower to increase the quantity of ion implantation, whereby a uniform ion implantation becomes possible.

In the manner described above, the analog-to-digital converter 14 converts the output signals of the amplifier 12 at the respective points $x_1$–$x_4$ on the x-axis in the scanning direction of the ion beam 8 into digital signals in succession and stores them into a memory circuit 16. A correction circuit 18 successively reads out the output signals a–d of the amplifier 12 at the respective points $x_1$–$x_4$ as stored in the memory circuit 16, and executes correction operations for making the quantity of implantation uniform to be described below. Letting $T_1$ denote the length of implantation time and $V_1$ denote the scanning rate of the ion beam at the point $x_1$, $1/V_1 \propto T_1$ holds. Likewise, $1/V_2 \propto T_2$ holds at the point $x_2$, $1/V_3 \propto T_3$ holds at the point $x_3$, and $1/V_4 \propto T_4$ holds at the point $x_4$. The quantities of ions which the ion implantation system implants actually in the respective scanning positions $x_1$–$x_4$ are the products between the ion beam intensities $a_1$, $a_2$, $a_3$ and $a_4$ previously stated and the lengths of implantation time $T_1$, $T_2$, $T_3$ and $T_4$, and the following equations are obtained:

$$T_1 a_1 + T_2 a_2 + T_3 a_3 + T_4 a_4 = \Sigma a \tag{1}$$

$$T_1 b_1 + T_2 b_2 + T_3 b_3 + T_4 b_4 = \Sigma b \tag{2}$$

$$T_1 c_1 + T_2 c_2 + T_3 c_3 + T_4 c_4 = \Sigma c \tag{3}$$

$$T_1 d_1 + T_2 d_2 + T_3 d_3 T_4 d_4 = \Sigma d \tag{4}$$

In order to correct the quantity of ion implantation to be uniform, the lengths of implantation time $T_1$, $T_2$, $T_3$ and $T_4$ may be set so as to establish:

$$\Sigma a = \Sigma b = \Sigma c = \Sigma d = K = \text{constant} \tag{5}$$

To this end, the simultaneous equations (1)–(5) may be solved for $T_1$, $T_2$, $T_3$ and $T_4$. The actual scanning rates are obtained to be $V_1 \propto 1/T_1$, $V_2 \propto 1/T_2$, $V_3 \propto 1/T_3$ and $V_4 \propto 1/T_4$ as stated before on the basis of $T_1$–$T_4$ evaluated from the above equations. When the scanning control is made so that the ion beam 8 may pass through the respective points at these rates, the uniform ion implantation can be carried out.

Although the example in which the number of the detectors is four has been explained, the number of detectors may be, in general, n. In this case, the number of scanning positions at which the ion beam is detected is also made n. Letting the length of implantation time at the n scanning positions $x_1$, $x_2$, $x_3$, ... $x_n$ be $T_1$, $T_2$, $T_3$, ... and $T_n$, and the outputs of the respective detectors at the respective scanning positions be $a_1$, $a_2$, $a_3$, ... and $a_n$; $b_1$, $b_2$, $b_3$, ... and $b_n$; $c_1$, $c_2$, $c_3$, ... and $c_n$; ... ; and $n_1$, $n_2$, $n_3$, ... and $n_n$, the values $T_1$, $T_2$, $T_3$, ... and $T_n$ to establish $\Sigma a = \Sigma b = \Sigma c = ... = \Sigma n = K$ (constant) may be obtained in the following equations:

$$\begin{cases} T_1 a_1 + T_2 a_2 + T_3 a_3 + \ldots + T_n a_n = \Sigma a \\ T_1 b_1 + T_2 b_2 + T_3 b_3 + \ldots + T_n b_n = \Sigma b \\ T_1 c_1 + T_2 c_2 + T_3 c_3 + \ldots + T_n c_n = \Sigma c \\ \vdots \\ T_1 n_1 + T_2 n_2 + T_3 n_3 + \ldots + T_n n_n = \Sigma n \end{cases}$$

The lengths of implantation time $T_1$–$T_4$ at the respective points $x_1$–$x_4$ evaluated by the correction circuit 18 as described above are stored into a memory device 20. Thereafter, in case of actually performing the ion implantation into the wafer 4, the detection device 10 is drawn upwards as viewed in the figure and is separated from the ion beam path so as not to impede the ion implantation into the wafer 4. Herein, upon receiving an instruction for starting the ion implantation, the memory device 20 reads out $T_1$–$T_4$ in succession at predetermined time intervals and gives them to a divider 22. The divider 22 prepares the inverse numbers $1/T_1$–$1/T_4$ of the respective lengths of implantation time $T_1$–$T_4$, and gives them to a digital-to-analog converter 24. The digital-to-analog converter 24 converts them into an analog signal, and applies it to a scanning rate-control circuit 26 as a command signal for the scanning rate. The scanning rate-control circuit 26 controls the energization current of a magnet used for the deflecting magnetic field 5 so that the rates at which the ion beam 8 passes through the respective points $x_1$–$x_4$ may become $V_1$–$V_4$.

The correction of the scanning rate of the ion beam may be made by inserting the ion beam detection device into the ion beam path during every exchange of the wafers 4 or at a selected suitable time.

For the deflection of the ion beam 8, a deflecting electric field may well be employed instead of the deflecting magnetic field 5.

Since the ion implantation system of the specified type is realized by the computer control, the memory circuits 16 and 20 need not be memories for exclusive use especially disposed, but areas of a memory prepared in advance may be allotted thereto. Further, the correction circuit 18 need not be a circuit for exclusive use, but the necessary correction operations can be executed by the software of a computer.

Although the semiconductor wafers have been exemplified as the object of the ion implantation, the substrates to be implanted are not restricted thereto, but metal ions may be implanted into metal materials as well.

As described above, this invention controls the scanning rate of an ion beam by arranging ion beam detectors in correspondence with a plurality of places of a substrate to be implanted with the ion beam and executing correction operations so that when the ion beam is scanned, the quantities of implantation obtained as the sums of output signals of the respective detectors in the plurality of scanning positions may become constant. Thus, even when the ion density of the ion beam is nonuniform in case of deflecting and scanning the ion beam, the ion density to be actually implanted into the substrate becomes uniform.

We claim:

1. A beam scanning control method for ion implantation, which comprises the steps of:
   (1) generating an ion beam,
   (2) scanning the ion beam in a predetermined direction in a predetermined range of scanning angle of the ion beam,
   (3) arranging a plurality of detectors to space them apart from one another in the predetermined direction in the predetermined range of scanning angle of the ion beam, and
   (4) calculating scanning rates of the ion beam at a plurality of scanning positions of the ion beam to substantially satisfy $\Sigma a = \Sigma b = \Sigma c = \ldots = \Sigma n = K$ (constant) in the following equations:

$$T_1 a_1 + T_2 a_2 + T_3 a_3 + \ldots + T_n a_n = \Sigma a$$
$$T_1 b_1 + T_2 b_2 + T_3 b_3 + \ldots + T_n b_n = \Sigma b$$
$$T_1 c_1 + T_2 c_2 + T_3 c_3 + \ldots + T_n c_n = \Sigma c$$
$$\vdots$$
$$T_1 n_1 + T_2 n_2 + T_3 n_3 \ldots + T_n n_n = \Sigma n$$

where $T_1, T_2, T_3 \ldots$ and $T_n$ are the lengths of implantation time of the ion beam at the plurality of scanning positions of the ion beam, and $a_1, a_2, a_3, \ldots$ and $a_n$; $b_1, b_2, b_3, \ldots$ and $b_n$; $c_1, c_2, c_3, \ldots$ and $c_n$; and $n_1, n_2, n_3, \ldots$ and $n_n$ are output signals of the detectors at each of the plurality of scanning positions of the ion beam.

2. A beam scanning control method for ion implantation, which comprises the steps of:
   (1) generating an ion beam,
   (2) scanning the ion beam in a predetermined direction in a predetermined range of scanning angle of the ion beam,
   (3) arranging a plurality of detectors to space them apart from one another in the predetermined direction in the predetermined range of scanning angle of the ion beam, and
   (4) calculating the lengths of implantation time of the ion beam at a plurality of scanning positions of the ion beam to substantially satisfy $\Sigma a = \Sigma b = \Sigma c = \ldots = \Sigma n = K$ (constant) in the following equations:

$$T_1 a_1 + T_2 a_2 + T_3 a_3 + \ldots + T_n a_n = \Sigma a$$
$$T_1 b_1 + T_2 b_2 + T_3 b_3 + \ldots + T_n b_n = \Sigma b$$
$$T_1 c_1 + T_2 c_2 + T_3 c_3 + \ldots + T_n c_n = \Sigma c$$
$$\vdots$$
$$T_1 n_1 + T_2 n_2 + T_3 n_3 + \ldots + T_n n_n = \Sigma n$$

$T_1, T_2, T_3, \ldots$ and $T_n$ being the lengths of implantation time of the ion beam, and $a_1, a_2, a_3, \ldots$ and $a_n$; $b_1, b_2, b_3, \ldots$ and $b_n$; $c_1, c_2, c_3, \ldots$ and $c_n$; and $n_1, n_2, n_3, \ldots$ and $n_n$ being output signals of the detectors at each of the plurality of scanning positions of the ion beam.

3. A beam scanning control method according to claim 2, comprising the additional steps of storing the calculated lengths of implantation time, and reading the stored lengths of implantation time and obtaining reciprocals thereof as the scanning rates of the ion beam.

4. A beam scanning control method according to claim 3, further comprising the steps of displacing the plurality of detectors out of the predetermined range of scanning angle of the ion beam, arranging a specimen at a position at which the specimen is bombarded with the ion beam, and controlling the ion beam so as to scan the specimen with the ion beam at the obtained scanning rates.

5. A beam scanning control device for an ion implantation system, which comprises:
   (1) means for generating an ion beam,
   (2) means for scanning the ion beam in a predetermined direction in a predetermined range of scanning angle of the ion beam,
   (3) means for arranging a plurality of detectors in spaced apart positions from one another in the predetermined range of scanning angle of the ion beam, and
   (4) means for calculating scanning rates of the ion beam at a plurality of scanning positions of the ion beam to substantially satisfy $\Sigma a = \Sigma b = \Sigma c \ldots = \Sigma n = K$ (constant) in the following equations:

$$T_1 a_1 + T_2 a_2 + T_3 a_3 + \ldots + T_n a_n = \Sigma a$$
$$T_1 b_1 + T_2 b_2 + T_3 b_3 + \ldots + T_n b_n = \Sigma b$$
$$T_1 c_1 + T_2 c_2 + T_3 c_3 + \ldots + T_n c_n = \Sigma c$$
$$\vdots$$
$$T_1 n_1 + T_2 n_2 + T_3 n_3 + \ldots + T_n n_n = \Sigma n$$

wherein $T_1, T_2, T_3, \ldots$ and $T_n$ are the lengths of implantation time of the ion beam at the plurality of scanning positions of the ion beam, and $a_1, a_2, a_3, \ldots$ and $a_n$; $b_1, b_2, b_3, \ldots$ and $b_n$; $c_1, c_2, c_3, \ldots$ and $c_n$; and $n_1, n_2, n_3, \ldots$ and $n_n$ are output signals of the detectors at each of the plurality of scannng positions of the ion beam.

6. A beam scanning control device for an ion implantation system, which comprises:
   (1) means for generating an ion beam,
   (2) means for scanning the ion beam in a predetermined direction in a predetermined range of scanning angle of the ion beam, (3) means for arranging a plurality of detectors in spaced apart positions from one another in a predetermined direction in the predetermined range of scanning angle of the ion beam, and (4) means for calculating the lengths of implantation time of the ion beam at a plurality of scanning positions of the ion beam to substantially satisfy $\Sigma a = \Sigma b = \Sigma c = \ldots = \Sigma n = K$ (constant) in the following equations:

$$T_1 a_1 + T_2 a_2 + T_3 a_3 + \ldots + T_n a_n = \Sigma a$$
$$T_1 b_1 + T_2 b_2 + T_3 b_3 + \ldots + T_n b_n = \Sigma b$$
$$T_1 c_1 + T_2 c_2 + T_3 c_3 + \ldots + T_n c_n = \Sigma c$$
$$\vdots$$
$$T_1 n_1 + T_2 n_2 + T_3 n_3 + \ldots + T_n n_n = \Sigma n$$

$T_1, T_2, T_3, \ldots$ and $T_n$ being the lengths of implantation time of the ion beam, and $a_1, a_2, a_3, \ldots$ and $a_n$; $b_1, b_2, b_3, \ldots$ and $b_n$; $c_1, c_2, c_3, \ldots$ and $c_n$; and $n_1, n_2, n_3, \ldots$ and $n_n$ being output signals of the detectors at each of the plurality of the scanning positions of the ion beam.

7. A beam scanning control device for an ion implantation system according to claim 6, further comprising means for storing the calculated lengths of implantation time, and means for reading the stored lengths of implantation time and obtaining reciprocals thereof as the scanning rates of the ion beam.

8. A beam scanning control device for an ion implantation system according to claim 7, further comprising means for arranging a specimen at a position at which the specimen is bombarded with the ion beam, and means for controlling the ion beam so as to scan the specimen with the ion beam at the obtained scanning rates.

9. A beam scanning control device for an ion implantation system according to claim 8, wherein the calculating means comprises means for converting the output signals into digital signals, and means for storing the digital signals, the lengths of implantation time being calculated on the basis of the stored digital signals.

10. A beam scanning control device for an ion implantation system according to claim 9, further comprising means for storing the calculated lengths of implantation time as digital quantities, means for generating reciprocal signals of the stored digital quantities as those representative of the scanning rates of the ion beam, means for converting the reciprocal signals into analog signals, means for arranging a specimen at a position at which the specimen is bombarded with the ion beam, and means for controlling the ion beam so as to scan the specimen with the ion beam on the basis of the converted analog signals.

* * * * *